(12) United States Patent
Mizutani et al.

(10) Patent No.: US 6,563,058 B2
(45) Date of Patent: May 13, 2003

(54) MULTILAYERED CIRCUIT BOARD AND METHOD FOR PRODUCING THE SAME

(75) Inventors: Yasuhiko Mizutani, Komaki (JP); Takami Hirai, Nishikamo-gun (JP); Kazuyuki Mizuno, Kasugai (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/802,752

(22) Filed: Mar. 8, 2001

(65) Prior Publication Data

US 2002/0005295 A1 Jan. 17, 2002

(30) Foreign Application Priority Data

Mar. 10, 2000 (JP) .......................... 2000-067378

(51) Int. Cl.[7] .......................... H05K 1/11; H01R 12/04
(52) U.S. Cl. ..................... 174/262; 174/260; 174/261; 174/264; 361/738; 361/760; 361/761; 361/766; 361/792
(58) Field of Search ................. 174/262, 260, 174/261, 264, 266, 255; 361/760, 792, 738, 761, 763, 766, 774, 782, 790, 811; 338/309, 318, 319, 320, 310, 311

(56) References Cited

U.S. PATENT DOCUMENTS

| 4,300,115 | A |   | 11/1981 | Ansell et al. |
| 4,800,459 | A | * | 1/1989 | Takagi et al. ............ 361/321.2 |
| 5,055,966 | A | * | 10/1991 | Smith et al. ............... 174/52.4 |
| 5,164,699 | A | * | 11/1992 | Smith et al. ................. 338/310 |
| 5,726,863 | A | * | 3/1998 | Nakayama et al. ......... 361/794 |
| 5,872,695 | A | * | 2/1999 | Fasano et al. ........... 361/301.4 |
| 5,977,490 | A | * | 11/1999 | Kawakita et al. ........... 174/265 |
| 5,985,461 | A | * | 11/1999 | Tani et al. ................... 428/433 |
| 6,021,050 | A | * | 2/2000 | Ehman et al. .............. 361/793 |
| 6,265,090 | B1 | * | 7/2001 | Nishide et al. ............. 428/701 |

FOREIGN PATENT DOCUMENTS

| JP | 59-17232 |   | 1/1984 |
| JP | 404025098 A | * | 1/1992 |
| JP | 09266379 A | * | 10/1997 |

* cited by examiner

Primary Examiner—David L. Talbott
Assistant Examiner—I B Patel
(74) Attorney, Agent, or Firm—Burr & Brown

(57) ABSTRACT

A multilayered circuit board is constructed such that holes penetrating through second and third dielectric layers, interposed between a pair of electrodes for constructing a capacitor, are filled with a material having a high dielectric constant respectively in a capacitor-forming area, and a plurality of (for example, four) holes are filled with a material having a high magnetic permeability respectively so as to penetrate through first to fifth dielectric layers in a magnetic flux-passing area of a coil constructed by coil electrodes of first to fifth turns in a coil-forming area.

10 Claims, 16 Drawing Sheets

MULTILAYERED CIRCUIT BOARD AND METHOD FOR PRODUCING THE SAME

FIELD OF THE INVENTION

The present invention relates to a multilayered circuit board constructed by laminating a plurality of sheet members in which, for example, electrodes formed on the different sheet members via-holes. The present invention also relates to a method for producing the multilayered circuit board.

BACKGROUND OF THE INVENTION

In general, a multilayered circuit board is constructed as follows. That is, for example, electrodes are formed on a surface of a green sheet (dielectric green sheet) composed of a dielectric material, via-holes filled with a conductive paste are arranged for the dielectric green sheets to conduct the electrodes between the sheets, and the plurality of dielectric green sheets are laminated and integrated into one unit by sintering them.

In the case of a conventional multilayered circuit board, when passive parts such as capacitors, coils, and resistors are mounted, the following methods are adopted: a method in which the passive parts are mounted as chip parts on the surface of the multilayered circuit board; and a method in which the passive parts are formed on the surface or at the inside of the multilayered circuit board.

It is required to realize a small size and a low price for the parts to be used for wireless communication system such as portable telephones. In the case of the method in which the chip parts are mounted on the surface of the multilayered circuit board, it is necessary to ensure a certain aerial size to mount the chip parts. Therefore, the shape of the substrate is determined by the aerial size, and there is a certain limit to realize the small size.

Description is made, for example, in Japanese Laid-Open Patent Publication No. 59-17232, in relation to the method in which the capacitors and resistors are formed on the surface or at the inside of the multilayered circuit board. In this method, a dielectric green sheet, a green sheet composed of a resistor material (resistor green sheet), and a green sheet composed of an insulator material (insulator green sheet) are previously prepared. For example, the dielectric green sheet, having a high dielectric constant, is allowed to intervene between the electrodes for constructing the capacitor. The resistor green sheet is allowed to intervene between the electrodes for constructing the resistor.

In the case of a conventional multilayered circuit board, there is no problem when a single electronic part is formed. However, the following inconvenience arises when a plurality of types of electronic parts are formed. That is, for example, when it is assumed that the capacitor and the resistor are formed in the multilayered circuit board, it is desirable that the dielectric green sheet, having a high dielectric constant, is allowed to intervene between the electrodes for constructing the capacitor, and the resistor green sheet, having a desired specific resistance, is allowed to intervene between the electrodes for constructing the resistor.

However, for example, when the capacitor and the resistor are formed in the same layer, the following inconvenience arises. That is, if the green sheet is changed so that the specific resistance of the resistor is a desired specific resistance, the green sheet, which is allowed to intervene between the electrodes for constructing the capacitor, is also changed simultaneously. Although the resistor successfully acquires the desired specific resistance, the capacitor fails to acquire a desired capacity.

When a plurality of capacitors are formed, it is necessary that all of the capacitors are arranged in the same layer, or the number of dielectric green sheets having the high dielectric constant is increased to arrange the plurality of capacitors in the different layers respectively. In the case of the former, the following problem arises. That is, the leading arrangement for the wiring is complicated, because the plurality of capacitors are formed in the same layer. As a result, the design is consequently restricted. Further, the characteristics are deteriorated, and the size is consequently increased as well, because the wiring arrangement is lengthened.

In the case of the latter, the following problem arises. That is, almost all portions of the green sheets for constructing the multilayered circuit board are occupied by the dielectric green sheets having the high specific resistance. As a result, unnecessary stray capacitance and coupling are increased, and it is impossible to obtain the desired device characteristics.

On the other hand, when the resistor is formed, the green sheet, which is positioned to intervene between the electrodes for constructing the resistor, is used after first being cut to have a necessary shape. For this reason, when a plurality of resistors having different resistance values are formed, it is necessary to cut the green sheet to have different shapes in conformity with the resistance values respectively. Therefore, the number of steps is increased.

In the case of this technique, for example, the following problem also arises. That is, the multilayered circuit board is distorted after the lamination, because the green sheet cut to have the desired shape is partially added and laminated.

SUMMARY OF THE INVENTION

The present invention has been made taking the foregoing problems into consideration, an object of which is to provide a multilayered circuit board and a method for producing the same in which the characteristics of the respective electronic parts can be improved, and it is possible to realize a small size as well, although a variety of types of electronic parts are formed.

According to the present invention, a multilayered circuit board is provided, constructed by laminating a plurality of sheet members. One or more via-holes are formed in each of the sheet members respectively, and a material in conformity with a type of an electronic part is inserted into the via-holes with which the electronic part is formed.

Accordingly, for example, a material having a high dielectric constant can be inserted into a via-hole disposed at a portion for forming a capacitor. A resistor material, capable of obtaining a desired resistance value, can be inserted into a via-hole disposed at a portion for forming a resistor. A material having a high magnetic permeability can be inserted into a via-hole disposed at a portion of a coil for transmitting a magnetic flux.

Therefore, it is unnecessary to change the sheet member in order to obtain the desired characteristics for a certain electronic part. It is enough to change only the material inserted into the via-hole. That is, the formation of the electronic parts is not affected by the characteristic of the sheet member. It is possible to improve the degree of freedom of the design, and it is possible to effectively realize a small size of the multilayered circuit board.

It is unnecessary that the electronic part of the same type is formed in the same layer. Therefore, the wiring is easily formed, and the characteristics of the electronic parts can have the desired characteristics. Further, it is possible to expand the degree of freedom of the design in consideration of the wiring.

For example, when the capacitor is formed with different layers, it is enough that the material having a high dielectric constant is inserted into the via-hole disposed at the portion for forming the capacitor. Therefore, it is unnecessary to laminate multiple layers of sheet members having the high dielectric constant. It is possible to suppress the increase in unnecessary stray capacitance and coupling.

Even when a plurality of resistors having different resistance values are formed, it is unnecessary to cut and laminate each of sheet members in conformity with the resistance value. The material itself which is inserted into the via-hole disposed at the portion for forming the resistor may be selected and inserted in conformity with the desired resistance value. Therefore, it is possible to avoid any occurrence of unnecessary strain in the multilayered circuit board. Further, it is possible to realize a small size for the multilayered circuit board.

When a plurality of types of the electronic parts are formed for the multilayered circuit board constructed as described above, it is also preferable the materials in conformity with the types of the electronic parts are inserted into the via-holes for forming the plurality of types of the electronic parts respectively.

It is preferable that an insulating material is inserted into the via-hole for forming no electronic part. Accordingly, for example, when the sheet members are laminated, sintered, and integrated into one unit, unnecessary shrinkage is not caused. It is possible to obtain the multilayered circuit board approximately as designed. For example, it is preferable that a material equivalent to the sheet member is used as the insulating material.

It is also preferable that electrodes for constructing each electronic part are formed at both end surfaces of the via-holes, respectively. In this arrangement, a resistor material may be inserted into a via-hole interposed between a pair of the electrodes for constructing a resistor, or a material having a high dielectric constant may be inserted into a via-hole interposed between a pair of the electrodes for constructing a capacitor. Further, a material having a high magnetic permeability may be inserted into a via-hole located at a magnetic flux-permeating portion surrounded by electrodes for constructing a coil.

It is preferable that the via-hole is formed by means of punching out with a die. In this case, it is easy to obtain the desired dimensional accuracy, and it is easy to obtain the desired characteristics of the electronic part.

According to another aspect of the present invention, a method for producing a multilayered circuit board constructed by laminating a plurality of sheet members is provided. The method includes a via-hole-forming step of forming one or more via-holes in each of the sheet members respectively, a material-inserting step of selectively inserting a material in conformity with a specific type of electronic part into the via-hole corresponding to a portion for forming the electronic part thereafter, an electrode-forming step of forming electrodes at the necessary portions of the respective sheet members, and a step of laminating and integrating the respective sheet members into one unit.

Accordingly, it is possible to easily manufacture the multilayered circuit board in which the characteristics of respective electronic parts can be improved, and it is possible to realize a small size as well, although a variety of types of electronic parts are formed.

It is preferable that in the via-hole-forming step, the via-hole is formed by means of punching out with a die. It is also preferable that in the material-inserting step, a resistor material is selectively inserted into a via-hole which is located at a portion for forming a resistor thereafter and which is interposed between a pair of the electrodes for constructing the resistor.

It is also preferable that in the material-inserting step, a material having a high dielectric constant is selectively inserted into the via-hole which is located at a portion for forming a capacitor thereafter and which is interposed between a pair of the electrodes for constructing the capacitor. It is also preferable that in the material-inserting step, a material having a high magnetic permeability in the step of inserting materials is selectively inserted into the via-hole which is located at a portion for forming a coil thereafter and which is disposed at a portion for permeating a magnetic flux.

Further, it is preferable that in the material-inserting step, an insulating material is selectively inserted into the via-hole for forming no electronic part. For example, it is preferable that a material equivalent to the sheet member is used as the insulating material.

Of course, when the wiring is made between the multiple layers with the via-holes, a conductive material is inserted into the concerning via-holes.

The above and other objects, features, and advantages of the present invention will become more apparent from the following description when taken in conjunction with the accompanying drawings in which a preferred embodiment of the present invention is shown by way of illustrative example.

DETAILED DESCRIPTION OF THE INVENTION

Illustrative embodiments of the multilayered circuit board and the method for producing the same according to the present invention will be explained below with reference to FIGS. 1 to 16.

Figure 1:
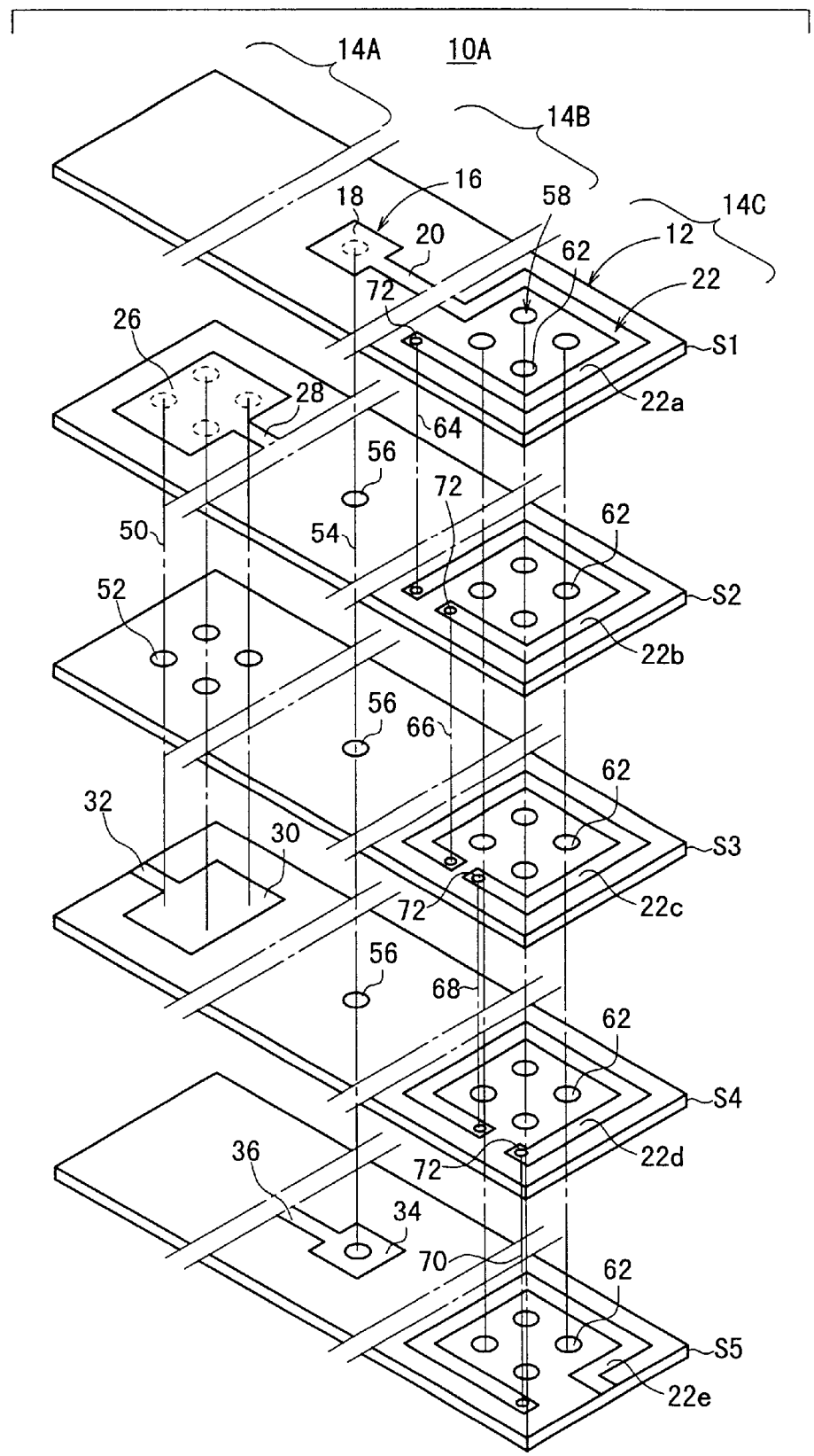
FIG. 1 shows an exploded perspective view illustrating a multilayered circuit board according to a first embodiment.
Figure 2:
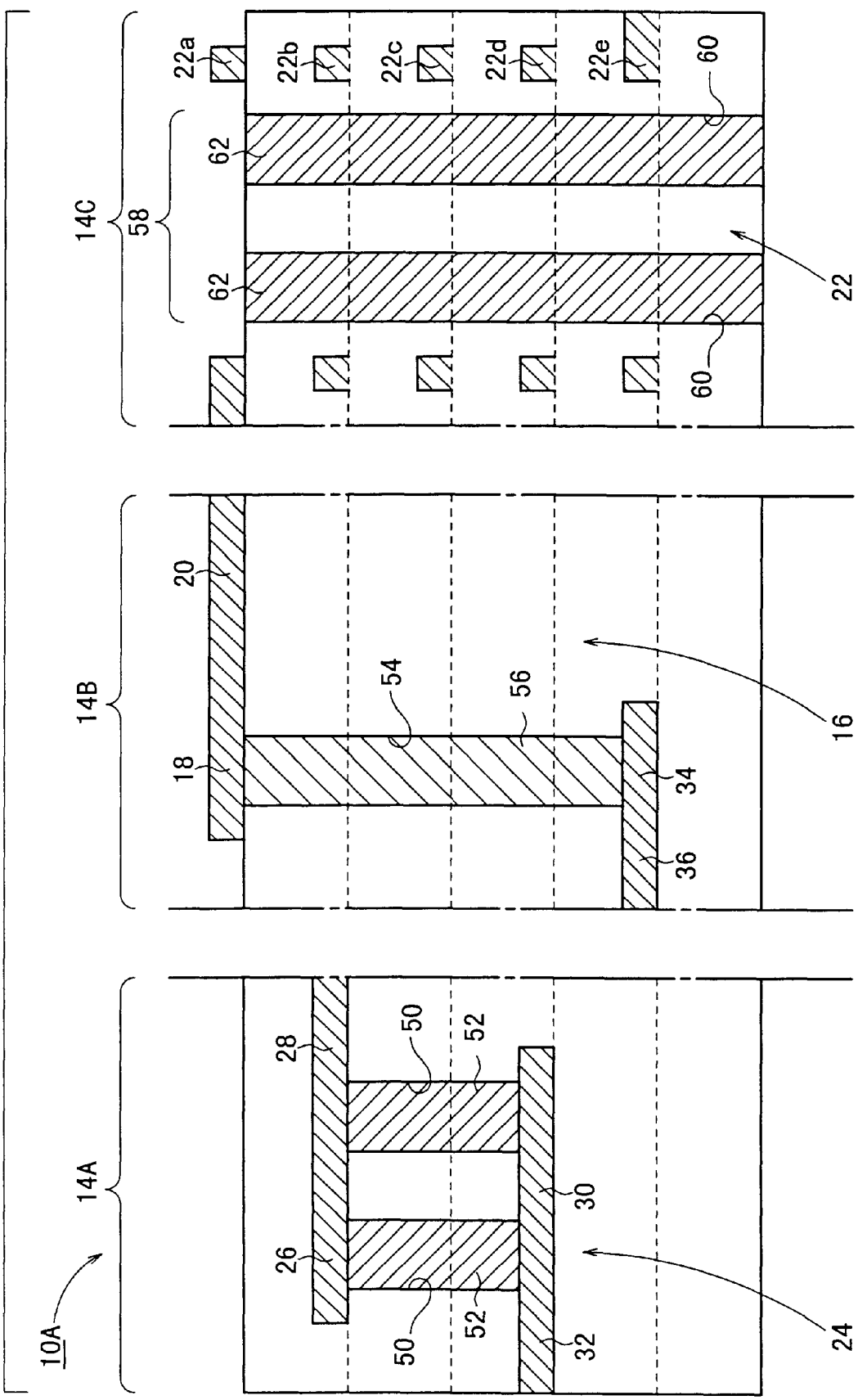
FIG. 2 show a sectional view illustrating the multilayered circuit board according to the first embodiment.

As shown in FIGS. 1 and 2, a multilayered circuit board 10A according to a first embodiment has a dielectric substrate 12 constructed by laminating a plurality of dielectric layers. The dielectric substrate 12 has a capacitor-forming area 14A, a resistor-forming area 14B, and a coil-forming area 14C.

In the first dielectric layer S1 of the dielectric substrate 12, a lead electrode 20 and a first electrode 18 for constructing a resistor 16 are formed in the resistor-forming area 14B, and a coil electrode 22a of the first turn for constructing a coil 22 is formed in the coil-forming area 14C. In the second dielectric layer S2, a lead electrode 28 and a first electrode 26 for constructing a capacitor 24 are formed in the capacitor-forming area 14A, and a coil electrode 22b of the second turn for constructing the coil 22 is formed in the coil-forming area 14C.

Similarly, in the third dielectric layer S3, a coil electrode 22c of the third turn for constructing the coil 22 is formed in the coil-forming area 14C. In the fourth dielectric layer S4, a lead electrode 32 and a second electrode 30 for constructing the capacitor 24 are formed in the capacitor-forming area 14A, and a coil electrode 22d of the fourth turn for constructing the coil 22 is formed in the coil-forming area 14C. In the fifth dielectric layer S5, a lead electrode 36 and a second electrode 34 for constructing the resistor 16 are formed in the resistor-forming area 14B, and a coil electrode 22e of the fifth turn for constructing the coil 22 is formed in the coil-forming area 14C.

In the capacitor-forming area 14A of the multilayered circuit board 10A according to the first embodiment, a plurality of (for example, four) via-holes 50 are formed to penetrate through the second and third dielectric layers S2, S3 interposed between the pair of electrodes 26, 30 for constructing the capacitor 24. Each of the via-holes 50 is filled with a high dielectric constant material 52 respectively.

In the resistor-forming area 14B, one or more via-holes 54 are formed to penetrate through the first to fourth dielectric layers S1 to S4 interposed between the pair of electrodes 18, 34 for constructing the resistor 16. The via-hole 54 is filled with a resistor material 56 for obtaining a desired resistance value. The embodiment shown in FIG. 1 is illustrative of a case in which the single via-holes 54 are provided.

In the coil-forming area 14C, a plurality of (for example, four) via-holes 60 are formed to penetrate through the first to fifth dielectric layers S1 to S5 in a magnetic flux-passing area 58 of the coil 22 constructed by the electrodes 22a to 22e of the first turn to the fifth turn. Each of the via-holes 60 is filled with a high magnetic permeability material 62 respectively.

In the coil-forming area 14C, a first via-hole 64 for conducting the coil electrode 22a of the first turn and the coil electrode 22b of the second turn is formed in the first dielectric layer S1, and a second via-hole 66 for conducting the coil electrode 22b of the second turn and the coil electrode 22c of the third turn is formed in the second dielectric layer S2.

A third via-hole 68 for conducting the coil electrode 22c of the third turn and the coil electrode 22d of the fourth turn is formed in the third dielectric layer S3, and a fourth via-hole 70 for conducting the coil electrode 22d of the fourth turn and the coil electrode 22e of the fifth turn is formed. Each of the first to fourth via-holes 64 to 70 is filled with a conductive material 72 respectively.

As described above, in the multilayered circuit board 10A according to the first embodiment, the plurality of dielectric layers S1 to S5, in which the plurality of via-holes 50, 54, 60, 64, 66, 68, 70 are formed respectively are prepared. The via-holes 50, which penetrate through the second and third dielectric layers S2, S3 are allowed to intervene between the pair of electrodes 26, 30 for constructing the capacitor 24. The via-holes 54, which penetrate through the first to fourth dielectric layers S1 to S4, are allowed to intervene between the pair of electrodes 18, 34 for constructing the resistor 16. The via-holes 60, which penetrate through the first to fifth dielectric layers S1 to S5, are located over the magnetic flux-passing area 58 of the coil 22.

Accordingly, the high dielectric constant material 52 can be inserted into the via-holes 50 disposed at the portion for forming the capacitor 24. The resistor material 56, with which the desired resistance value is successfully obtained, can be inserted into the via-holes 54 disposed at the portion for forming the resistor 16. The high magnetic permeability material 62 can be inserted into the via-holes 60 disposed in the magnetic flux-passing area 58 of the coil 22.

Therefore, for example, when the dielectric layer having a low dielectric constant is used for the first to fifth dielectric layers S1 to S5, the stray capacitance and the coupling are not increased, because only the portion of the via-hole 50 between the pair of electrodes 26, 30 for constructing the capacitor 24 is composed of the high dielectric constant material 52. The position of the via-hole can be set at an arbitrary portion in the dielectric layers S1 to S5, and hence the formation of the capacitor scarcely suffers from the restriction.

As for the resistor 16, unlike the method in which the sheet material for the resistor is laminated after being cut to have an appropriate shape as performed in the convention technique, the desired resistance value can be obtained by the resistor material 56 with which the via-hole 54 is filled. Therefore, it is possible to decrease aerial size on the plane.

As for the coil 22, although there is a certain limit (concerning the number of turns and the coil length) when the coil 22 is formed in the dielectric substrate 12, the via-hole 60 located in the magnetic flux-passing area 58 can be filled with the high magnetic permeability material. Therefore, it is possible to increase the inductance based on the coil 22.

As described above, in the multilayered circuit board 10A according to the first embodiment, it is unnecessary to change the dielectric layer in order to obtain a desired characteristic for a certain electronic part. It is enough to change only the material to be inserted into the via-hole. That is, the formation of the electronic part is not affected by the characteristic of the dielectric layer. It is possible to improve the degree of freedom of the design, and it is possible to effectively realize a small size of the multilayered circuit board 10A.

It is unnecessary that the electronic part of an identical type is formed in an identical layer. Therefore, the wiring is easily formed, and the characteristic of the electronic part can be allowed to have a desired characteristic. Further, it is possible to expand the degree of freedom of the design in consideration of the wiring.

For example, when the capacitor 24 is formed with different layers, it is enough that the high dielectric constant material 52 is inserted into the via-hole 50 disposed at the portion for forming the capacitor 24. Therefore, it is unnecessary to laminate multiple layers of sheet members having the high dielectric constant. It is possible to suppress the increase in unnecessary stray capacitance and coupling.

Even when a plurality of resistors 16 having different resistance values are formed, it is unnecessary to cut and laminate each of sheet members in conformity with the resistance values. It is enough that the resistor material 56, which is inserted into the via-hole 54 disposed at the portion for forming the resistor 16, is selected and inserted in conformity with a desired resistance value. Therefore, it is possible to avoid any occurrence of unnecessary strain in the multilayered circuit board 10A. Further, it is possible to realize a small size of the multilayered circuit board 10A.

Next, a method for producing the multilayered circuit board 10A according to the first embodiment will be explained with reference to FIGS. 3A to 8.

Figure 3A:
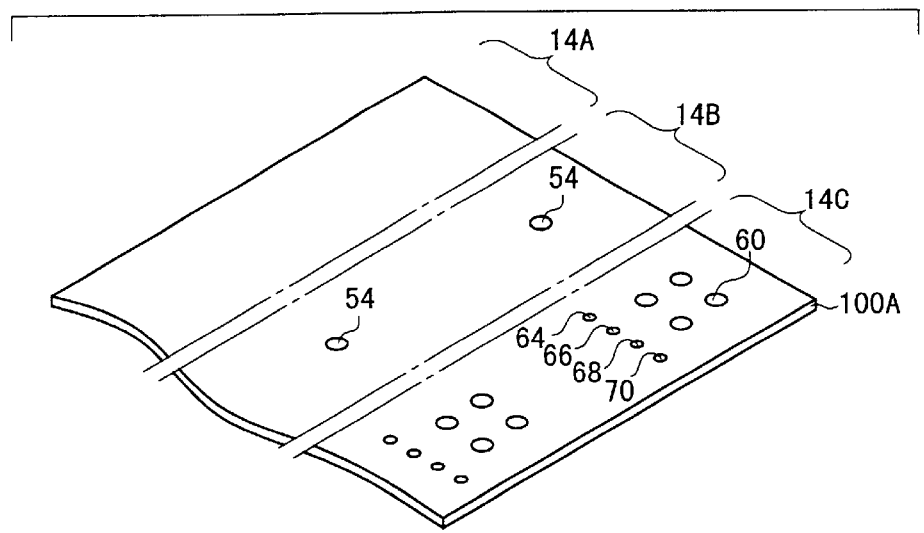
FIGS. 3A to 3C show perspective views illustrating, with partial cutaway, first to third green sheets.
Figure 3B:
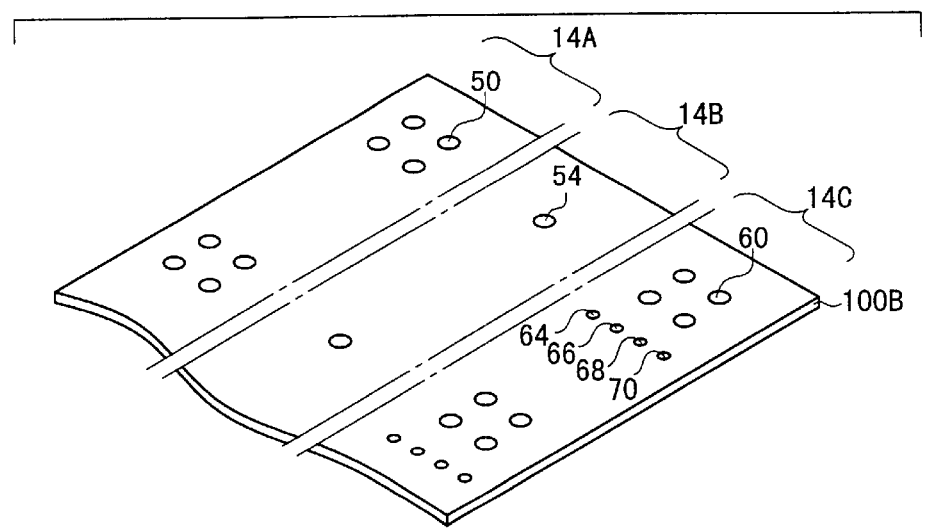
Figure 3C:
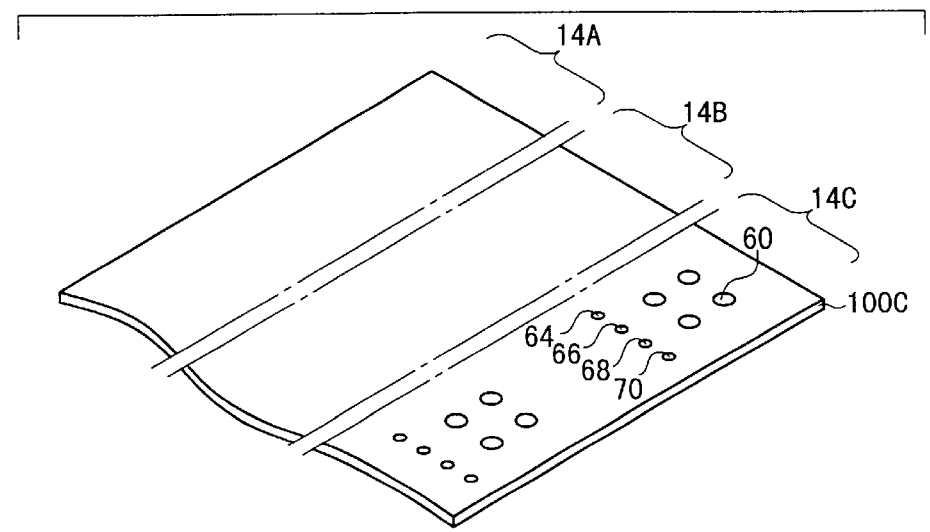

At first, as shown in FIGS. 3A to 3C, three types of wide-width green sheets 100A to 100C are prepared. As shown in FIG. 3A, in the first green sheet 100A, each of the capacitor-forming areas 14A is provided with no via-hole, each of the resistor-forming areas 14B is provided with the one via-hole 54 respectively, and each of the coil-forming areas 14C is provided with the four via-holes 60 and the first to fourth via-holes 64, 66, 68, 70 respectively.

As shown in FIG. 3B, in the second green sheet 100B, each of the capacitor-forming areas 14A is provided with the four via-hole 50 respectively, each of the resistor-forming areas 14B is provided with the one via-hole 54 respectively, and each of the coil-forming areas 14C is provided with the four via-holes 60 and the first to fourth via-holes 64, 66, 68, 70 respectively.

As shown in FIG. 3C, in the third green sheet 100C, each of the capacitor-forming areas 14A and each of the resistor-forming areas 14B are provided with no via-hole, and each of the coil-forming areas 14C is provided with the four via-holes 60 and the first to fourth via-holes 64, 66, 68, 70 respectively.

Figure 4A:
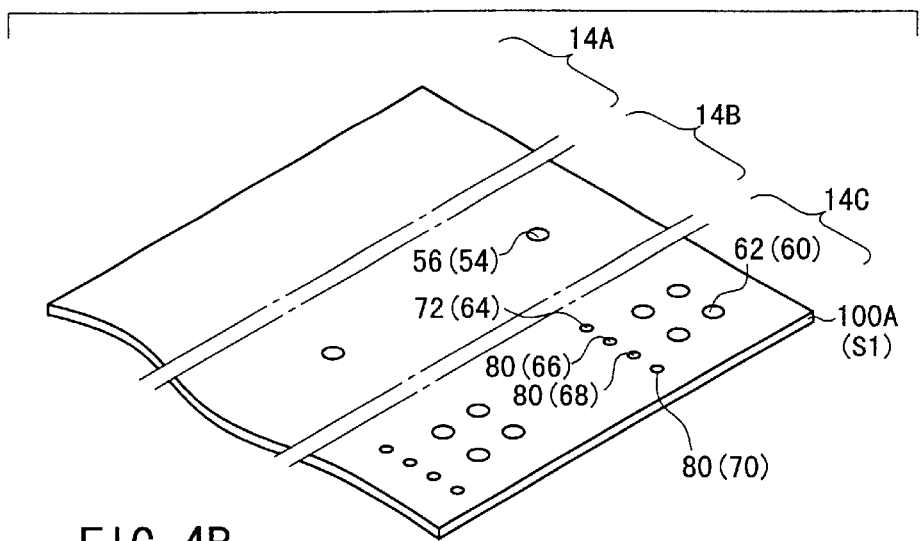
FIG. 4A shows a perspective view illustrating a state in which respective via-holes of the first green sheet to be formed into a first dielectric layer are filled with pastes of various materials.
Figure 4B:
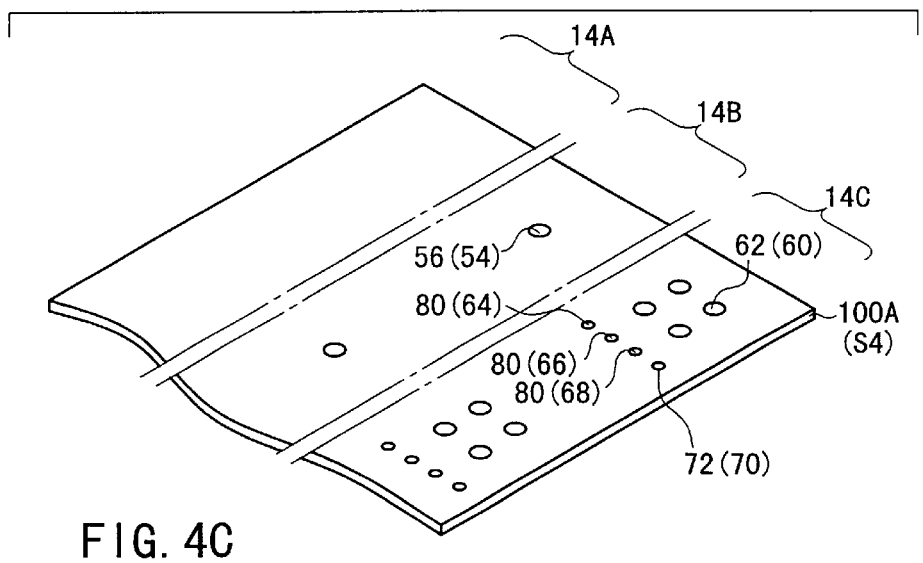
FIG. 4B shows a perspective view illustrating a state in which respective via-holes of the first green sheet to be formed into a fourth dielectric layer are filled with pastes of various materials.

As shown in FIGS. 4A and 4B, the via-holes 54 in the resistor-forming area 14B of the first green sheet 100A to be formed into the first and fourth dielectric layers S1, S2 are selectively filled with the paste of the resistor material 56, for example, by means of the screen printing. The via-holes 60 in the coil-forming area 14C are selectively filled with the paste of the high magnetic permeability material 62, for example, by means of the screen printing.

Further, as shown in FIG. 4A, the first via-hole 64 in the coil-forming area 14C of the first green sheet 100A to be formed into the first dielectric layer S1 is selectively filled with the paste of the conductive material 72, for example, by means of the screen printing. The other second to fourth via-holes 66, 68, 70 are selectively filled with the paste of the insulating material 80, for example, the paste made of the same material as that of the green sheet respectively.

As shown in FIG. 4B, the fourth via-hole 70 in the coil-forming area 14C of the first green sheet 100A to be formed into the fourth dielectric layer S4 is selectively filled with the paste of the conductive material 72, for example, by means of the screen printing. The other first to third via-holes 64, 66, 68 are selectively filled with the paste of the insulating material 80 respectively.

Figure 4C:
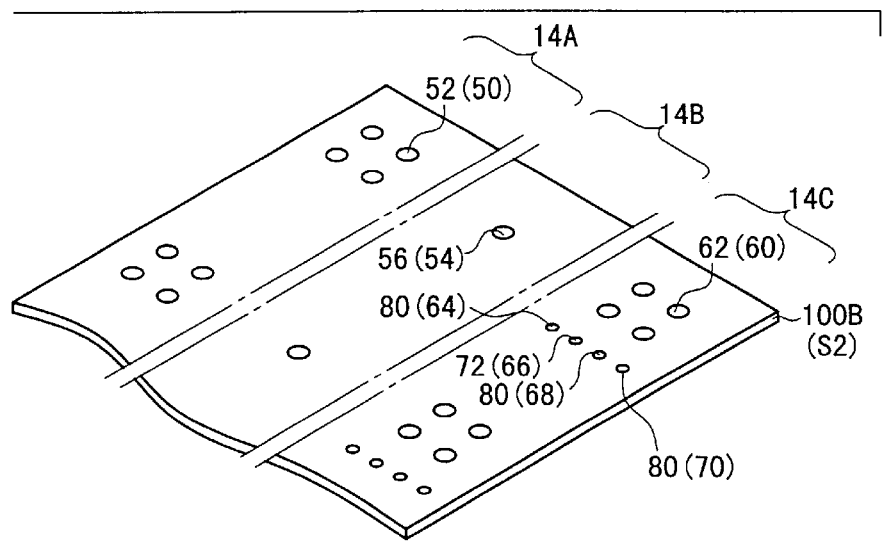
FIG. 4C shows a perspective view illustrating a state in which respective via-holes of the second green sheet to be formed into a second dielectric layer are filled with pastes of various materials.
Figure 5A:
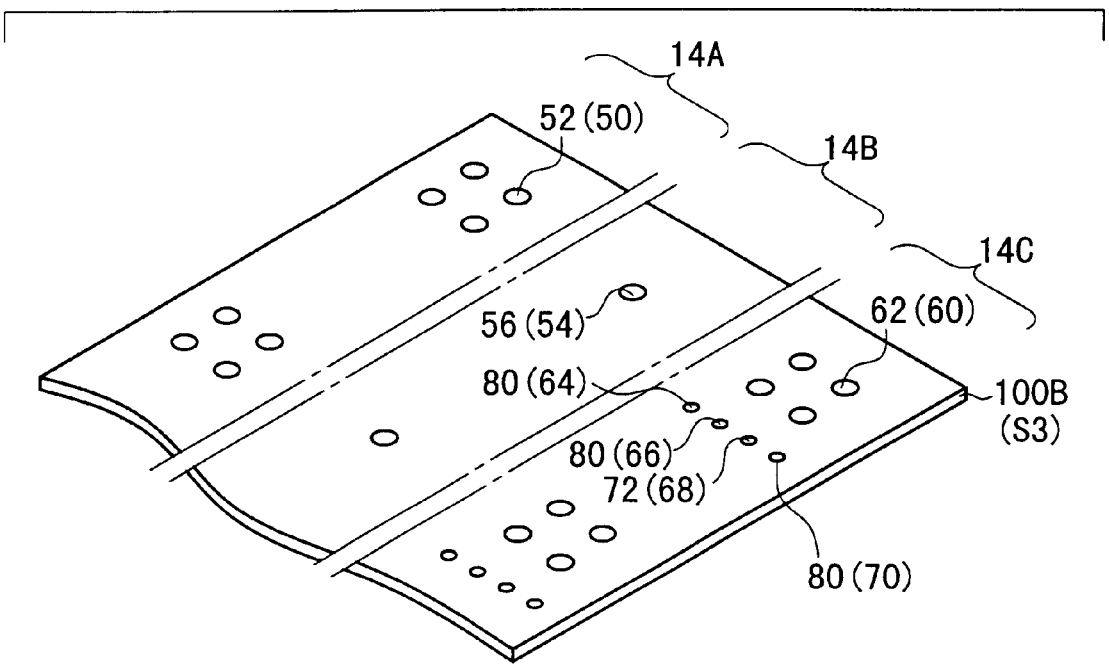
FIG. 5A shows a perspective view illustrating a state in which respective via-holes of the second green sheet to be formed into a third dielectric layer are filled with pastes of various materials.

Subsequently, as shown in FIGS. 4C and 5A, the via-holes 50 in the capacitor-forming area 14A of the second green sheet 100B to be formed into the second and third dielectric layers S2, S3 are selectively filled with the paste of the high dielectric constant material 52, for example, by means of the screen printing. Subsequently, the via-holes 54 in the resistor-forming area 14B are selectively filled with the resistor material 56 in the same manner as described above. After that, the via-holes 60 in the coil-forming area 14C are selectively filled with the high magnetic permeability material 62.

Further, as shown in FIG. 4C, the second via-hole 66 in the coil-forming area 14C of the second green sheet 100B to be formed into the second dielectric layer S2 is selectively filled with the paste of the conductive material 72, for example, by means of the screen printing. The other first, third, and fourth via-holes 64, 68, 70 are selectively filled with the paste of the insulating material 80 respectively.

As shown in FIG. 5A, the third via-hole 68 in the coil-forming area 14C of the second green sheet 100B to be formed into the third dielectric layer S3 is selectively filled with the paste of the conductive material 72, for example, by means of the screen printing. The other first, second, and fourth via-holes 64, 66, 70 are selectively filled with the paste of the insulating material 80 respectively.

Figure 5B:
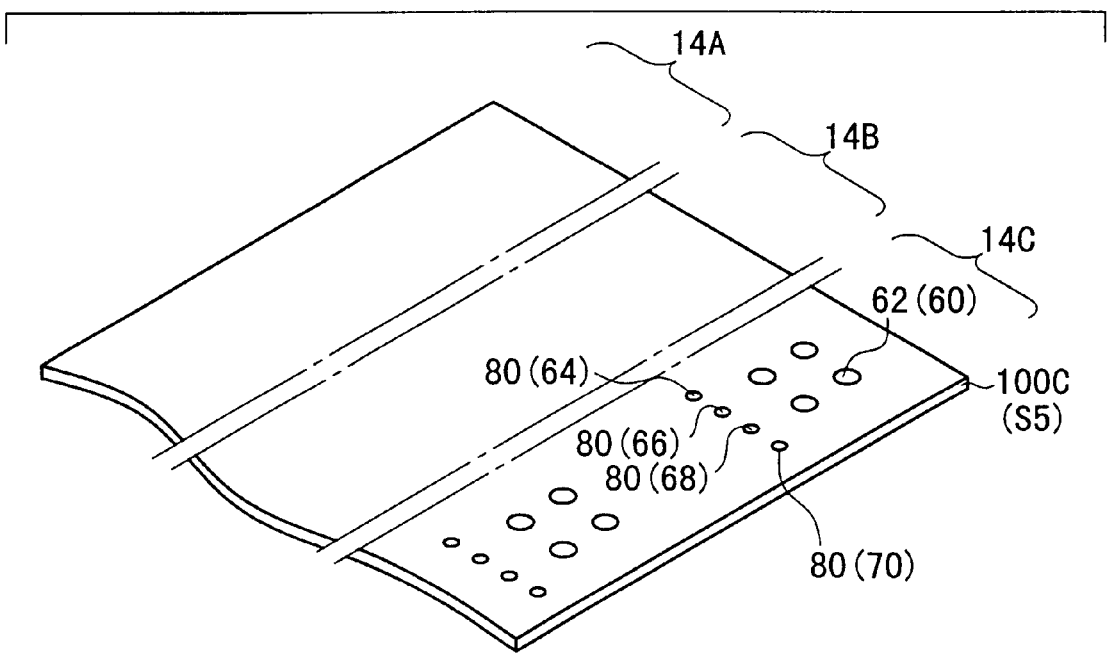
FIG. 5B shows a perspective view illustrating a state in which respective via-holes of the third green sheet to be formed into a fifth dielectric layer are filled with pastes of various materials.

Subsequently, as shown in FIG. 5B, the via-holes 60 in the coil-forming area 14C of the third green sheet 100C to be formed into the fifth dielectric layer S5 is selectively filled with the high magnetic permeability material 62. Further, the first to fourth via-holes 64, 66, 68, 70 in the coil-forming area 14C are selectively filled with the insulating material 80 respectively.

Figure 6A:
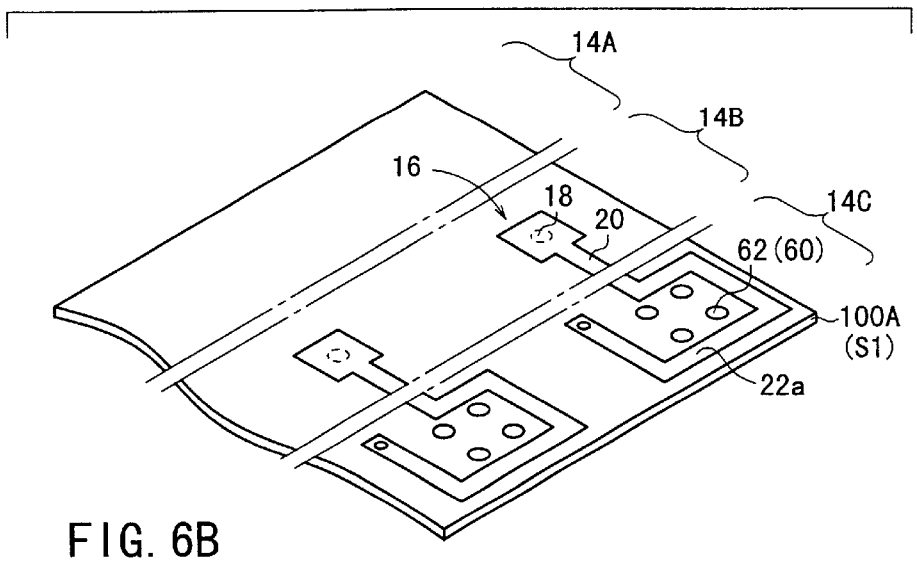
FIG. 6A shows a perspective view illustrating a state in which various electrodes are formed for the first green sheet to be formed into the first dielectric layer.

As shown in FIG. 6A, in the first green sheet 100A to be formed into the first dielectric layer S1 of the first green sheet 100A, the lead electrode 20 and the first electrode 18 for constructing the resistor 16 are formed in each of the resistor-forming areas 14B, and the coil electrode 22a of the first turn is formed in each of the coil-forming areas 14C.

Figure 6B:
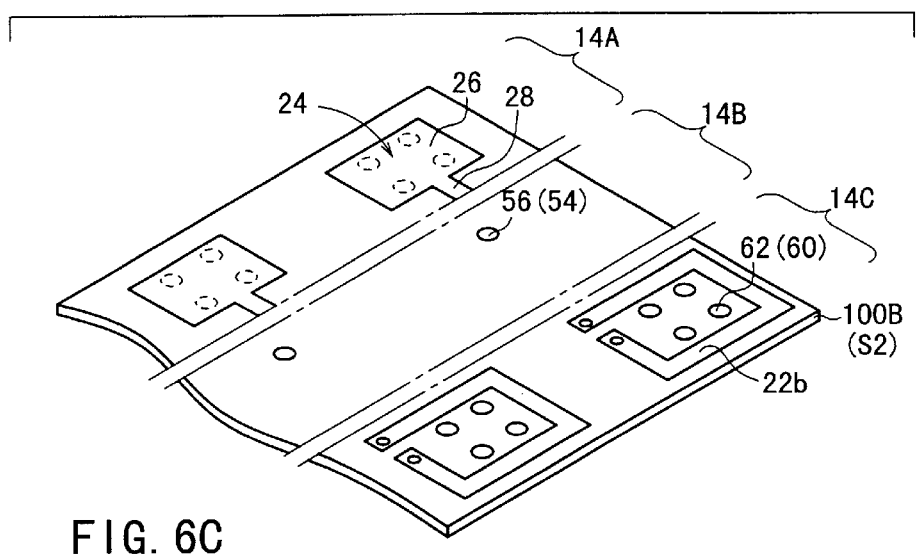
FIG. 6B shows a perspective view illustrating a state in which various electrodes are formed for the second green sheet to be formed into the second dielectric layer.

As shown in FIG. 6B, in the second green sheet 100B to be formed into the second layer of the dielectric layer S2 of the second green sheet 100B, the lead electrode 28 and the first electrode 26 for constructing the capacitor 24 are formed in each of the capacitor-forming areas 14A, and the coil electrode 22b of the second turn is formed in each of the coil-forming areas 14C.

Figure 6C:
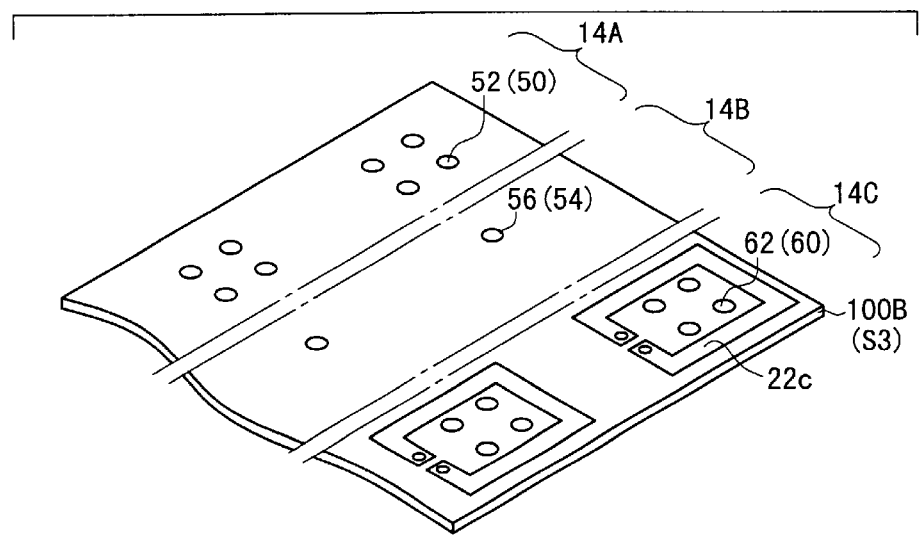
FIG. 6C shows a perspective view illustrating a state in which various electrodes are formed for the second green sheet to be formed into the third dielectric layer.

As shown in FIG. 6C, in the second green sheet 100B to be formed into the second dielectric layer S3 of the second green sheet 100B, the coil electrode 22c of the third turn is formed in each of the coil-forming areas 14C.

Figure 7A:
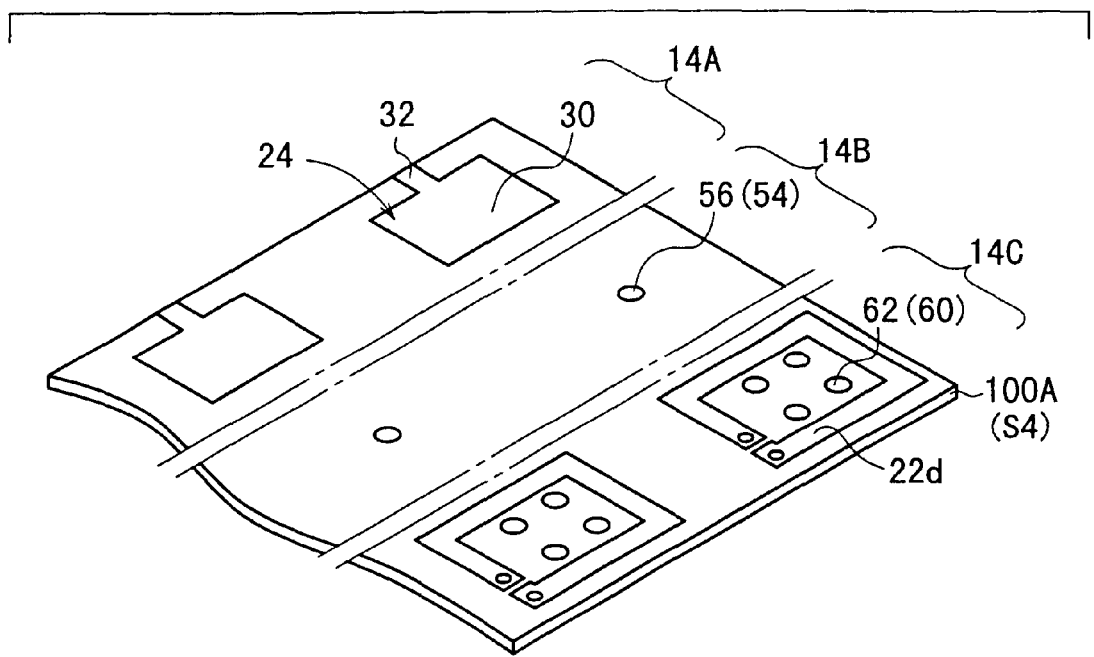
FIG. 7A shows a perspective view illustrating a state in which various electrodes are formed or the first green sheet to be formed into the fourth dielectric layer.

As shown in FIG. 7A, in the first green sheet 100A to be formed into the fourth dielectric layer S4 of the first green sheet 100A, the lead electrode 32 and the second electrode 30 for constructing the capacitor 24 are formed in each of the capacitor-forming areas 14A, and the coil electrode 22d of the fourth turn is formed in each of the coil-forming areas 14C.

Figure 7B:
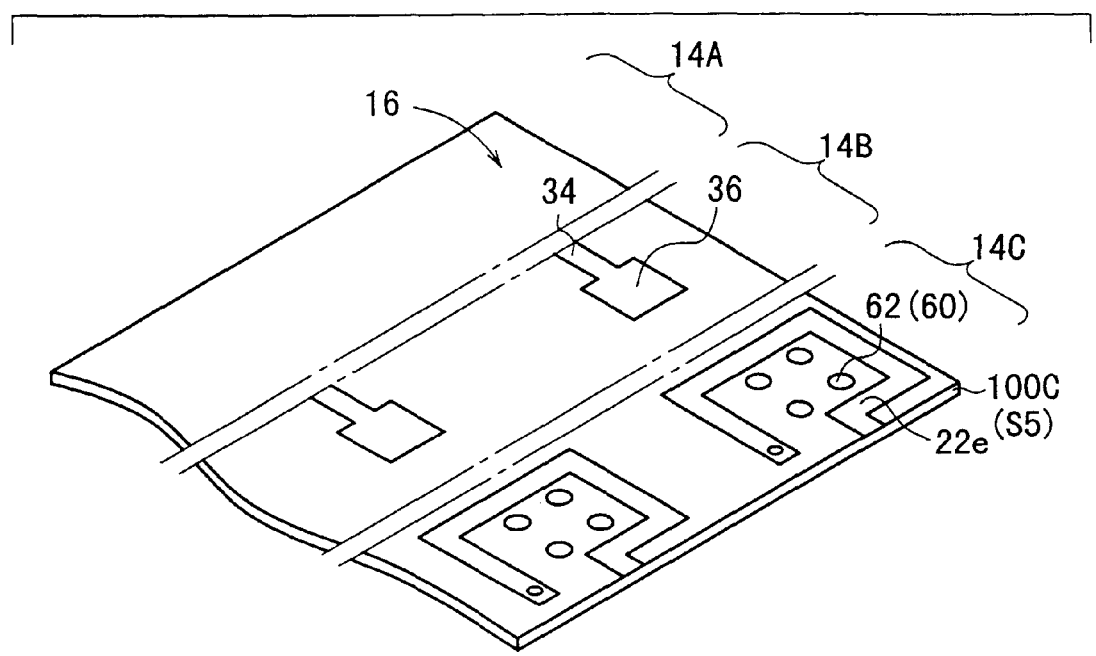
FIG. 7B shows a perspective view illustrating a state in which various electrodes are formed for the third green sheet to be formed into the fifth dielectric layer.

As shown in FIG. 7B, in the third green sheet 100C to be formed into the fifth dielectric layer S5, the lead electrode 36 and the second electrode 34 for constructing the resistor 16 are formed in each of the resistor-forming areas 14B, and the coil electrode 22e of the fifth turn is formed in each of the coil-forming areas 14C.

Figure 8:
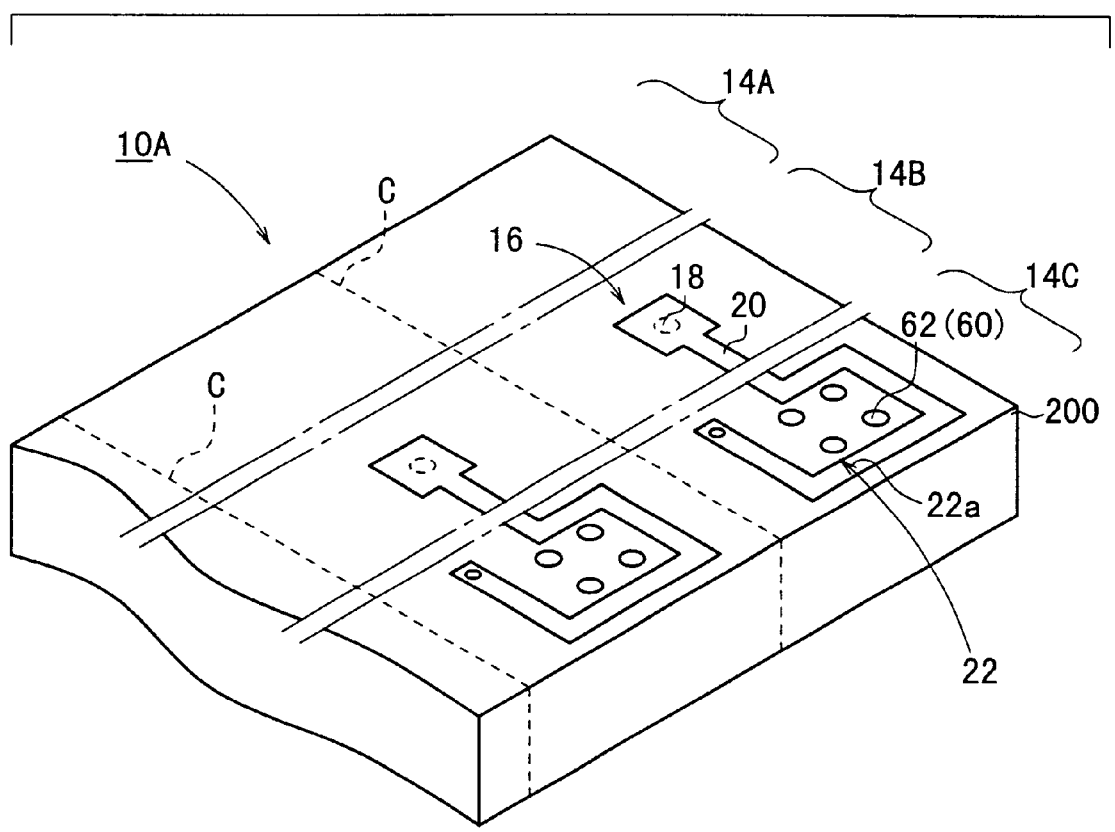
FIG. 8 shows a perspective view illustrating, with partial cutaway, a state in which the first to third green sheets are laminated, sintered, and integrated into one unit to manufacture a wide-width ceramic substrate.

Subsequently, as shown in FIG. 8, the first to third green sheets 100A to 100C are laminated, sintered, and integrated into one unit to manufacture a wide-width ceramic substrate 200. After that, the ceramic substrate 200 is cut at predetermined positions (see cutting lines C) respectively to obtain a plurality of multilayered circuit boards 10A.

In the method for producing the multilayered circuit board 10A according to the first embodiment, it is possible to easily manufacture the multilayered circuit board in which the characteristics of respective electronic parts can be improved, and it is possible to realize a small size as well, although a variety of types of electronic parts are formed.

When the respective via-holes are formed, for example, it is possible to adopt a method in which the via-hole is bored with an NC punch; a method in which the via-hole is punched out with a die; and a method in which the via-hole is bored with a laser. However, the method based on the NC punch is time-consuming, which is disadvantageous in mass-production. The method based on the laser involves a problem concerning the accuracy, because the diameter at the upper surface is different from the diameter at the lower surface of each of the via-holes due to the difference in energy of the laser beam. Therefore, the via-hole can be formed most accurately by means of the punching out based on the die.

When the multilayered circuit board 10A according to the first embodiment is manufactured by using the punching out based on the die, it is necessary to prepare at least three types of dies in conformity with the types of the green sheets 100A to 100C.

Next, a multilayered circuit board 10B according to a second embodiment will be explained with reference to FIGS. 9 and 10. Components or parts corresponding to those shown in FIGS. 1 and 2 are designated by the same reference numerals, duplicate explanation of which will be omitted.

Figure 9:
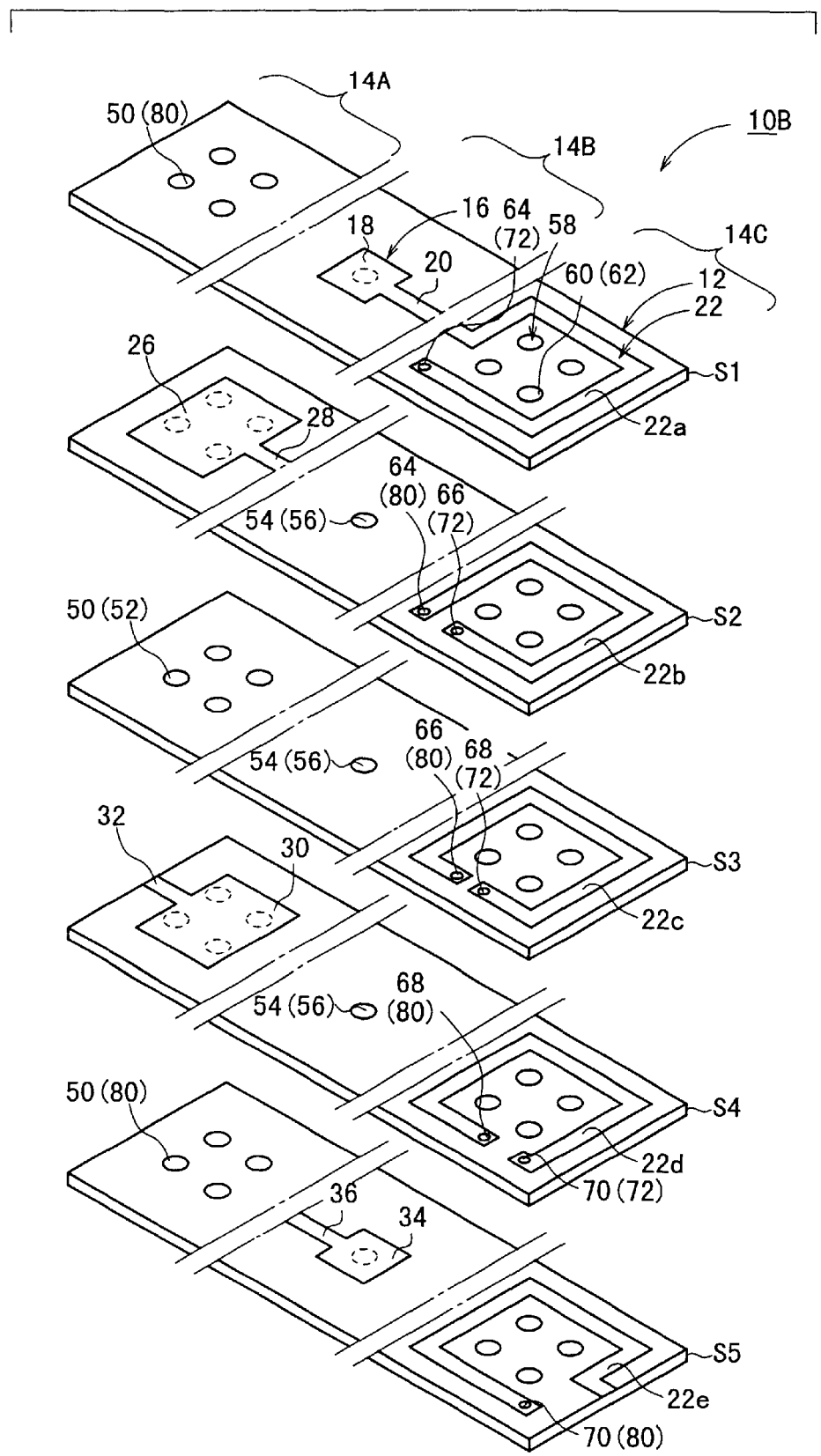
FIG. 9 shows an exploded perspective view illustrating a multilayered circuit board according to a second embodiment.
Figure 10:
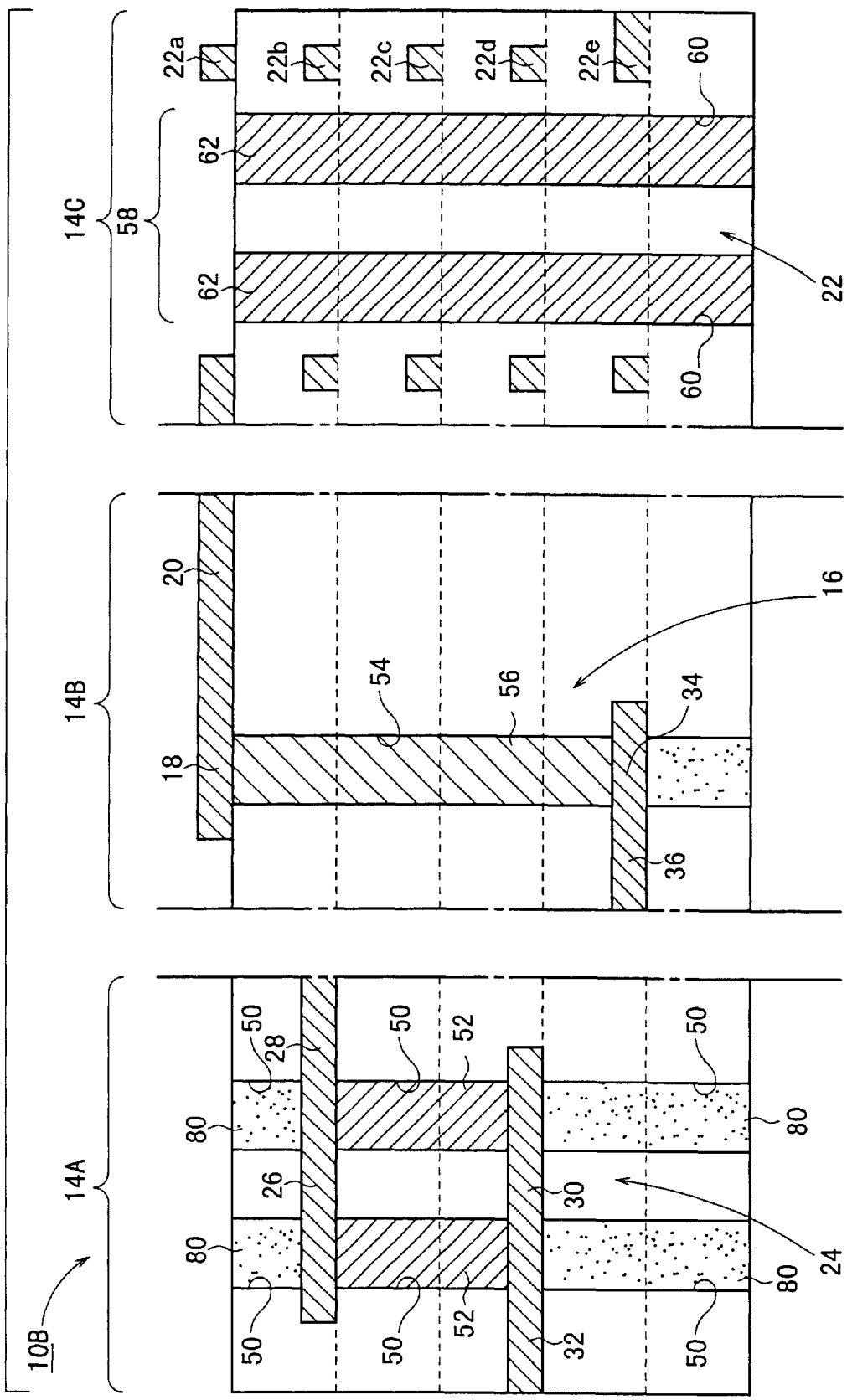
FIG. 10 shows a sectional view illustrating the multilayered circuit board according to the second embodiment.

As shown in FIGS. 9 and 10, the multilayered circuit board 10B according to the second embodiment is constructed in approximately the same manner as the multilayered circuit board 10A according to the first embodiment described above. However, the former is different from the latter in that all of via-holes are formed at identical positions in first to fifth dielectric layers S1 to S5.

That is, as shown in FIG. 9, four via-holes 50 are formed in each of capacitor-forming areas 14A of the first to fifth dielectric layers S1 to S5 respectively. One via-hole 54 is formed in each of resistor-forming areas 14B respectively. Four via-holes 60 and first to fourth via-holes 64, 66, 68, 70 are formed in each of coil-forming areas 14C respectively.

As shown in FIGS. 9 and 10, in the capacitor-forming area 14A, the respective via-holes of all of the first, fourth, and fifth dielectric layers S1, S4, S5 are filled with the insulating material 80. The four via-holes 50 penetrating through the second and third dielectric layers S2, S3 are filled with the high dielectric constant material 52.

In the resistor-forming area 14B, the via-holes 54 penetrating through the first to fourth dielectric layers S1 to S4 are filled with the resistor material 56. The via-hole 54 penetrating through the fifth dielectric layer S5 is filled with the insulating material 80.

In the coil-forming area 14C, all of the four via-holes 60 penetrating through the first to fifth dielectric layers S1 to S5 are filled with the high magnetic permeability material 62. Further, the first via-hole 64 of the first dielectric layer S1 is filled with the conductive material 72, and the remaining second to fourth via-holes 66, 68, 70 are filled with the insulating material 80. The second via-hole 66 of the second dielectric layer S2 is filled with the conductive material 72, and the remaining first, third, and fourth via-holes 64, 68, 70 are filled with the insulating material 80. Similarly, the third via-hole 68 of the third dielectric layer S3 is filled with the conductive material 72, and the remaining first, second, and fourth via-holes 64, 66, 70 are filled with the insulating material 80 respectively. The via-hole 70 of the fourth dielectric layer S4 is filled with the conductive material 72, and the remaining first to third via-holes 64, 66, 68 are filled with the insulating material 80 respectively. All of the first to fourth via-holes 64, 66, 68, 70 of the fifth dielectric layer S5 are filled with the insulating material 80.

In the multilayered circuit board 10B according to the second embodiment, in the same manner as in the multilayered circuit board 10A according to the first embodiment described above, the characteristics of respective electronic parts can be improved, and it is possible to realize a small size as well, although a variety of types of electronic parts are formed.

Next, a method for producing the multilayered circuit board 10B according to the second embodiment will be explained with reference to FIGS. 11 to 16.

Figure 11:
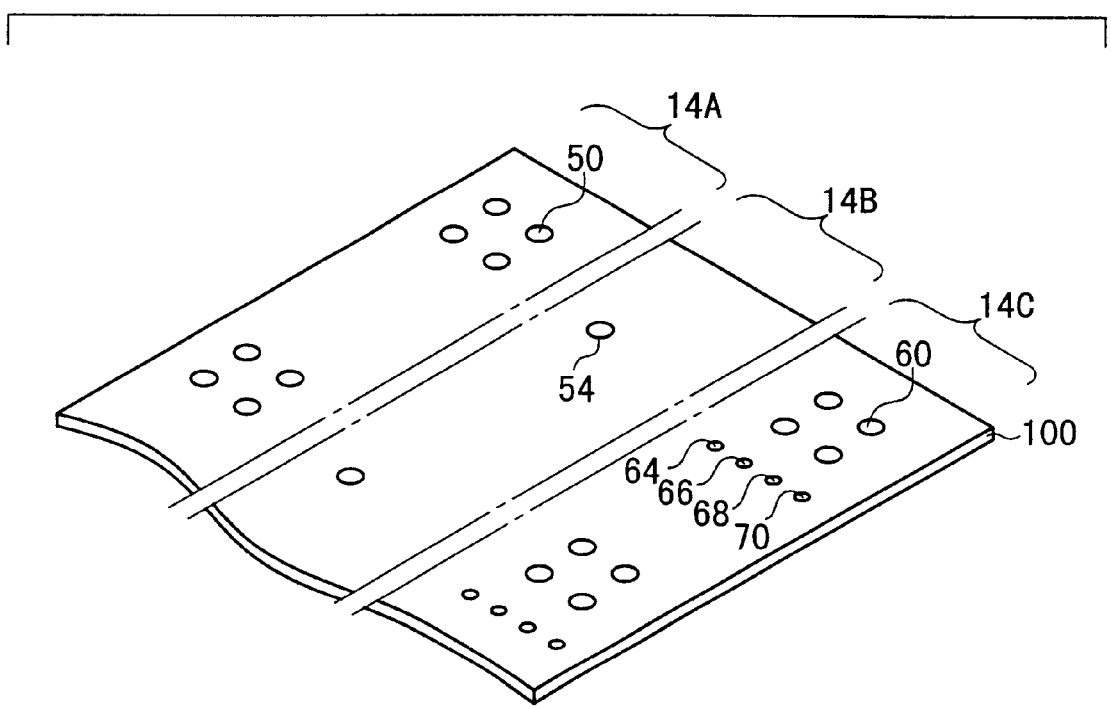
FIG. 11 shows a perspective view illustrating, with partial cutaway, a green sheet.

At first, as shown in FIG. 11, one type of wide-width green sheet 100 is prepared. In the green sheet 100, the four via-holes 50 are provided in the capacitor-forming area 14A, the one via-hole 54 is provided in the resistor-forming area 14B, and the four via-holes 60 and the first to fourth via-holes 64, 66, 68, 70 are provided in the coil-forming area 14C respectively.

Figure 12A:
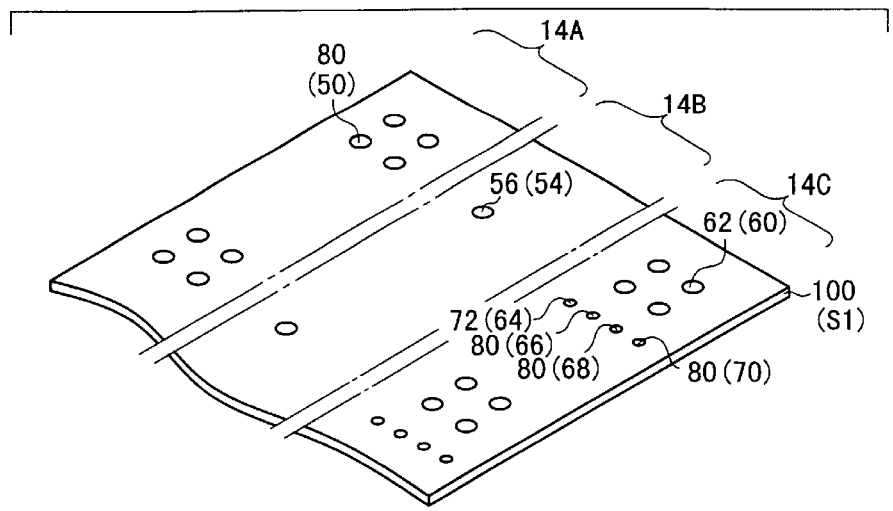
FIG. 12A shows a perspective view illustrating a state in which respective via-holes of the green sheet to be formed into a first dielectric layer are filled with pastes of various materials.
Figure 12B:
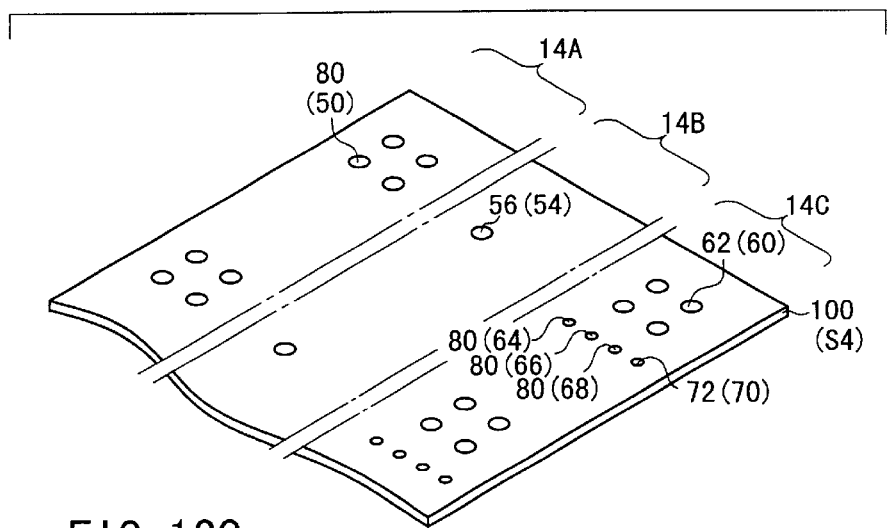
FIG. 12B shows a perspective view illustrating a state in which respective via-holes of the green sheet to be formed into a fourth dielectric layer are filled with pastes of various materials.

As shown in FIGS. 12A and 12B, in each of the capacitor-forming areas 14A of the green sheet 100 to be formed into the first and fourth dielectric layers S1, S4, the four via-holes 50 are selectively filled with the paste of the insulating material 80, for example, by means of the screen printing. In the resistor-forming area 14B, the via-hole 54 is filled with the paste of the resistor material 56.

In the coil-forming area 14C, the respective four via-holes 60 are selectively filled with the high magnetic permeability material 62 respectively. Further, as shown in FIG. 12A, the first via-hole 64 of the green sheet 100 to be formed into the first dielectric layer S1 is selectively filled with the conductive material 72, and the remaining second to fourth via-holes 66, 68, 70 are selectively filled with the insulating material 80 respectively. As shown in FIG. 12B, the fourth via-hole 70 of the green sheet 100 to be formed into the fourth dielectric layer S4 is selectively filled with the conductive material 72, and the remaining first to third via-holes 64, 66, 68 are selectively filled with the insulating material 80 respectively.

Figure 12C:
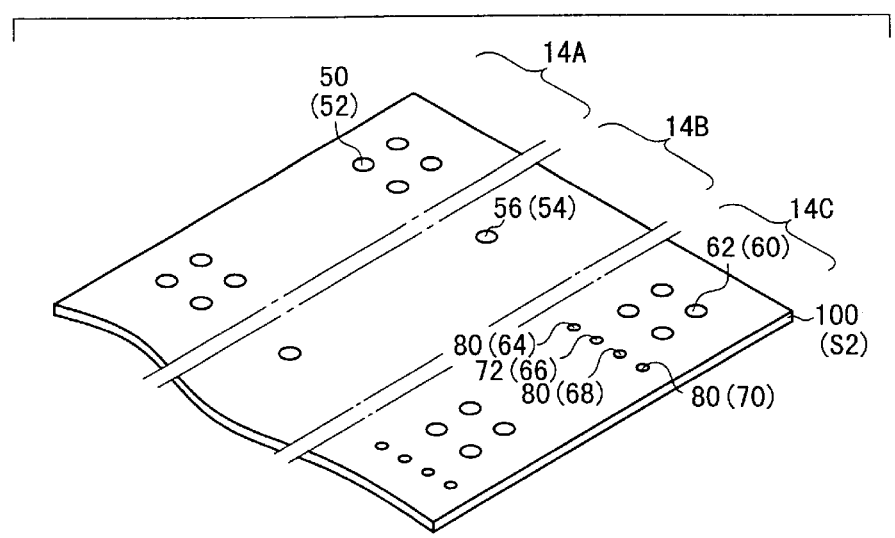
FIG. 12C shows a perspective view illustrating a state in which respective via-holes of the green sheet to be formed into a second dielectric layer are filled with pastes of various materials.

As shown in FIG. 12C, in each of the capacitor-forming areas 14A of the green sheet 100 to be formed into the second and third dielectric layers S2, S3, the four via-holes 50 are selectively filled with the high dielectric constant material 52, for example, by means of the screen printing respectively. In the resistor-forming area 14B, the via-hole 54 is filled with the paste of the resistor material 56.

Figure 13A:
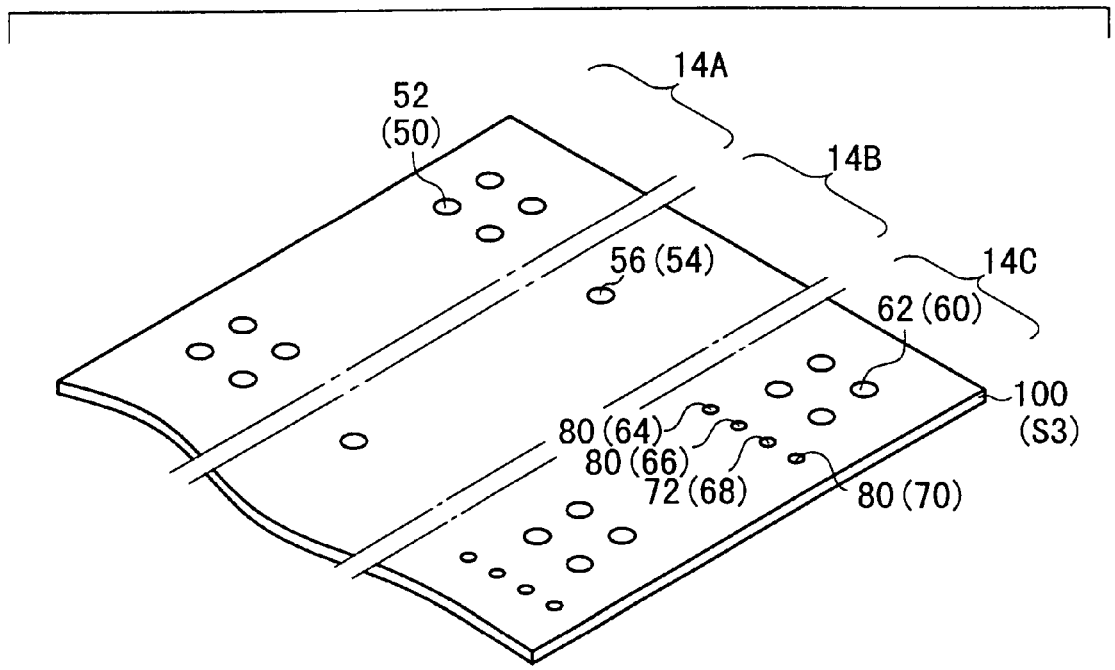
FIG. 13A shows a perspective view illustrating a state in which respective via-holes holes of the green sheet to be formed into a third dielectric layer are filled with pastes of various materials.
Figure 13B:
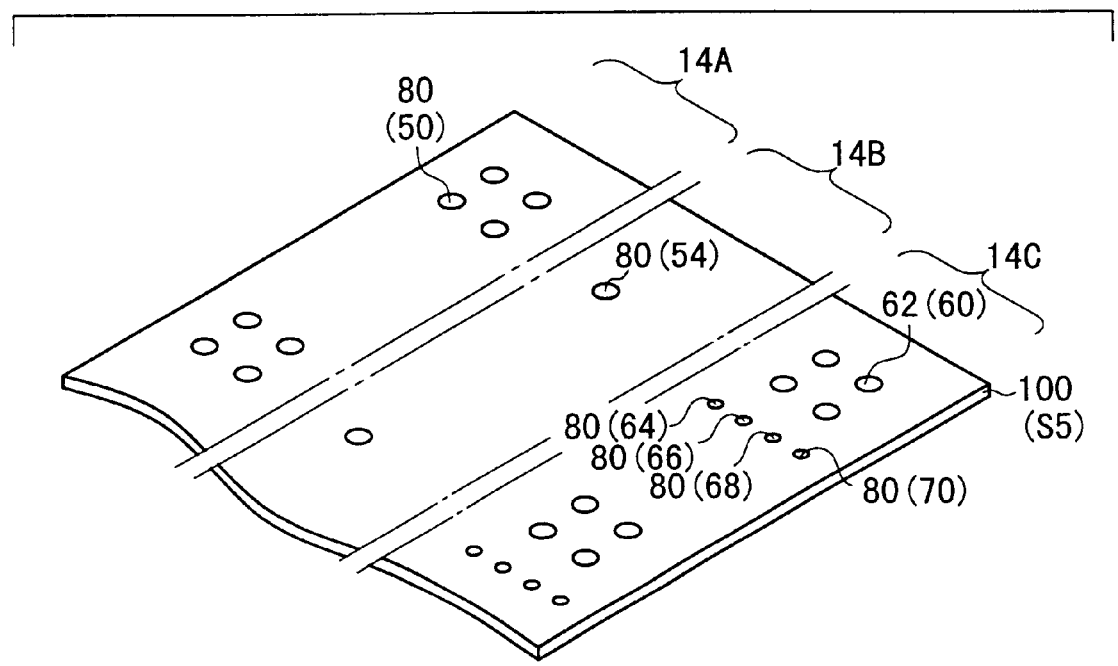
FIG. 13B shows a perspective view illustrating a state in which respective via-holes of the green sheet to be formed into a fifth dielectric layer are filled with pastes of various materials.

In the coil-forming area 14C, the four via-holes 60 are selectively filled with the high magnetic permeability material 62 respectively. Further, as shown in FIG. 12C, the second via-hole 66 of the green sheet 100 to be formed into the second dielectric layer S2 is selectively filled with the conductive material 72, and the remaining first, third, and fourth via-holes 64, 68, 70 are selectively filled with the insulating material 80 respectively. As shown in FIG. 13A, the third via-hole 68 of the green sheet 100 to be formed into the third dielectric layer S3 is selectively filled with the conductive material 72, and the remaining first, second, and fourth via-holes 64, 66, 70 are selectively filled with the insulating material 80 respectively.

In each of the capacitor-forming areas 14A of the green sheet 100 to be formed into the fifth dielectric layer S5, the four via-holes 50 are selectively filled with the paste of the insulating material 80, for example, by means of the screen printing respectively. In the resistor-forming area 14B, the via-hole 54 is filled with the paste of the insulating material 80. In the coil-forming area 14C, the four via-holes 60 are selectively filled with the high magnetic permeability material 62 respectively, and the first to fourth via-holes 64, 66, 68, 70 are selectively filled with the insulating material 80 respectively.

Figure 14A:
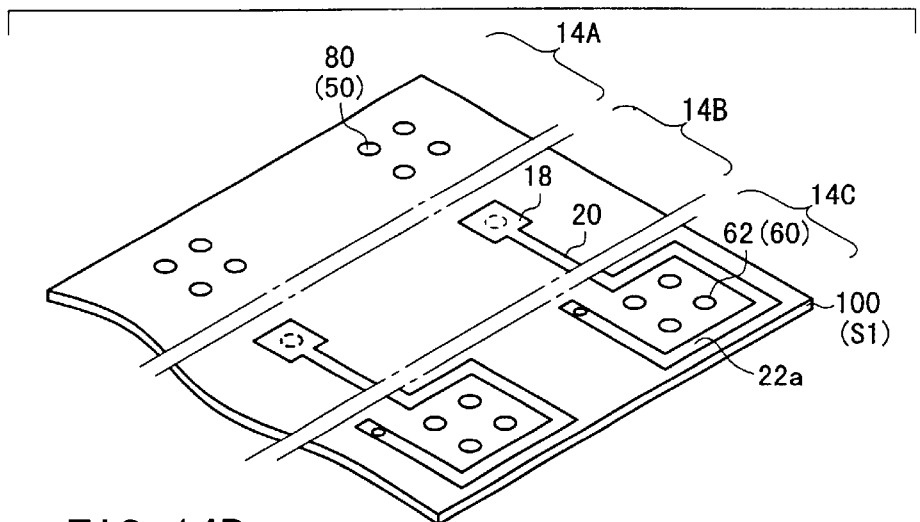
FIG. 14A shows a perspective view illustrating a state in which various electrodes are formed for the green sheet to be formed into the first dielectric layer.
Figure 14B:
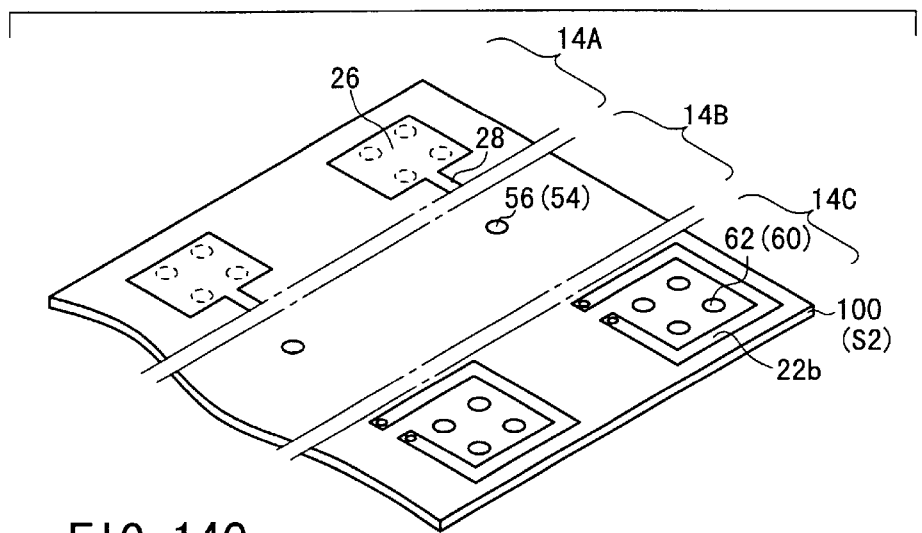
FIG. 14B shows a perspective view illustrating a state in which various electrodes are formed for the green sheet to be formed into the second dielectric layer.
Figure 14C:
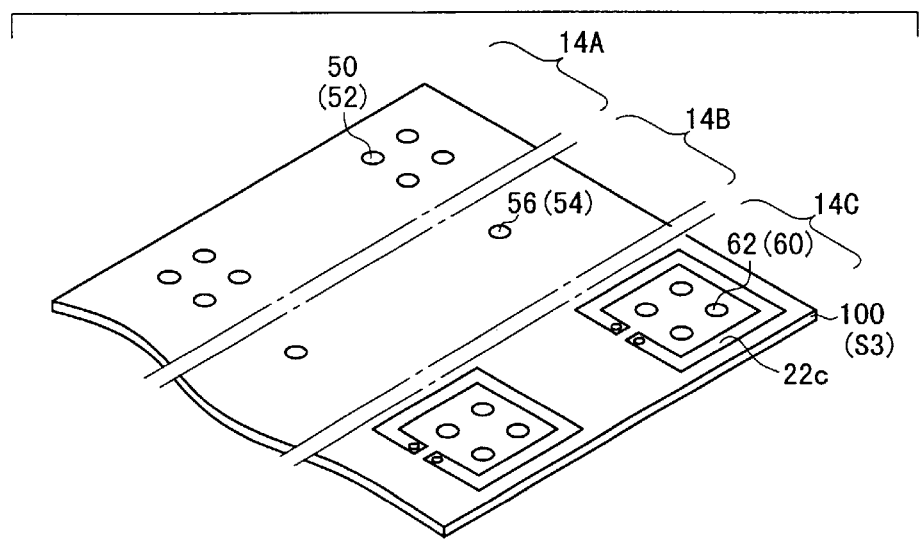
FIG. 14C shows a perspective view illustrating a state in which various electrodes are formed for the green sheet to be formed into the third dielectric layer.

As shown in FIG. 14A, in the green sheet 100 to be formed into the first dielectric layer S1, the lead electrode 20 and the first electrode 18 for constructing the resistor 16 are formed in each of the resistor-forming areas 14B, and the coil electrode 22c of the first turn is formed in each of the coil-forming areas 14C. As shown in FIG. 14B, in the green sheet 100 to be formed into the second dielectric layer S2, the lead electrode 28 and the first electrode 26 for constructing the capacitor 24 are formed in each of the capacitor-forming areas 14A, and the coil electrode 22b of the second turn is formed in each of the coil-forming areas 14C. As shown in FIG. 14C, in the green sheet 100 to be formed into the third dielectric layer S3, the coil electrode 22c of the third turn is formed in each of the coil-forming areas 14C.

Figure 15A:
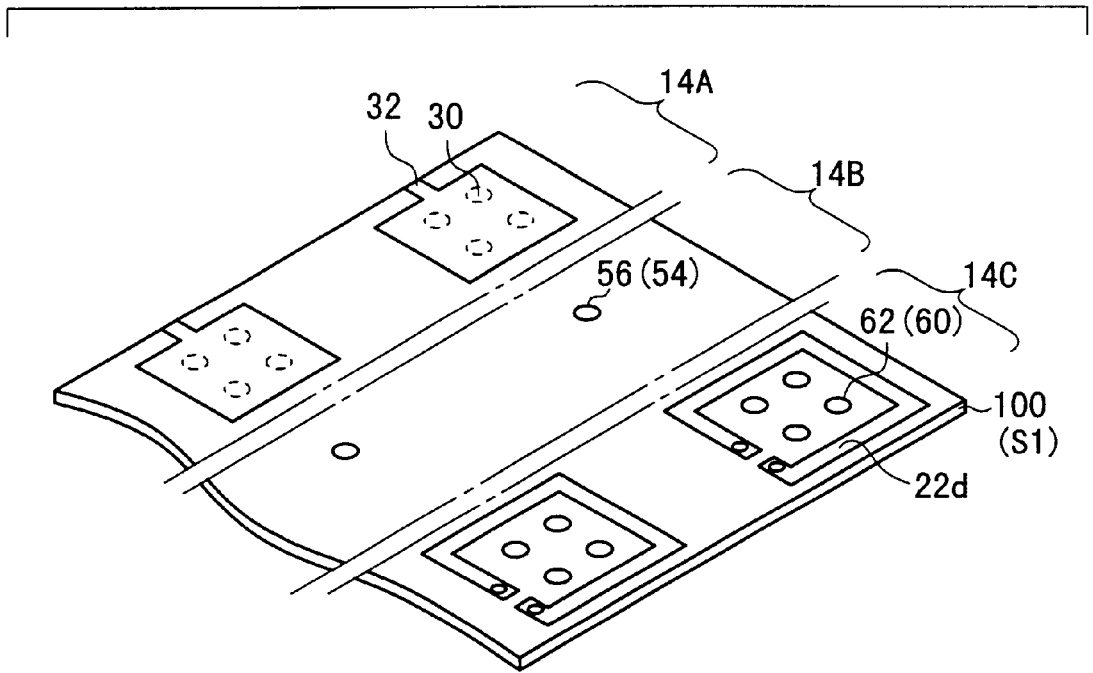
FIG. 15A shows a perspective view illustrating a state in which various electrodes are formed for the green sheet to be formed into the fourth dielectric layer.
Figure 15B:
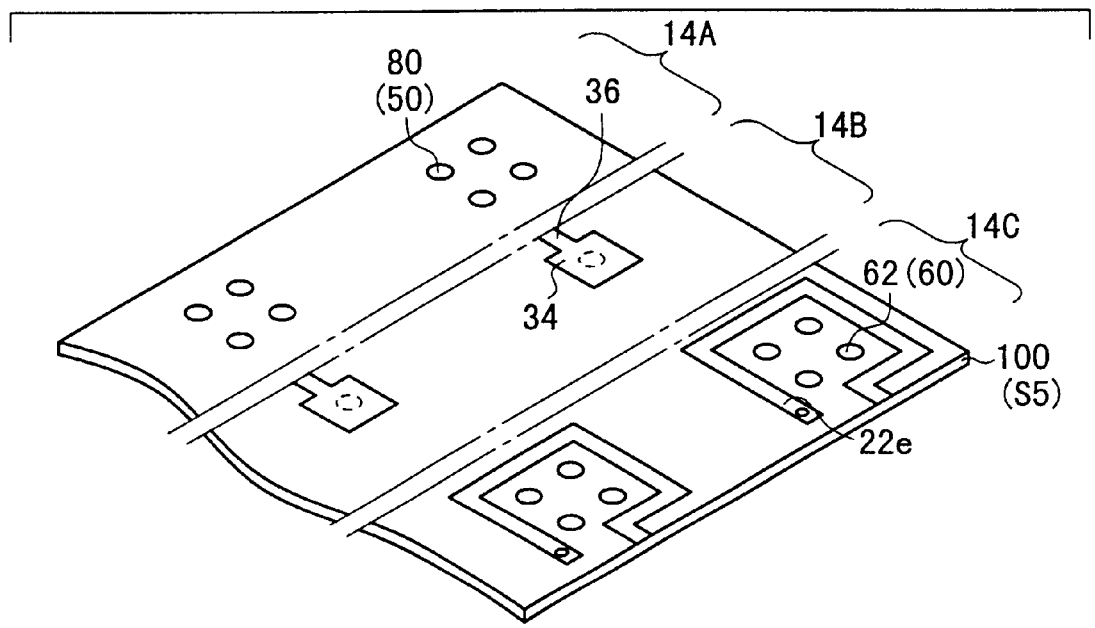
FIG. 15B shows a perspective view illustrating a state in which various electrodes are formed for the green sheet to be formed into the fifth dielectric layer.

As shown in FIG. 15A, in the green sheet 100 to be formed into the fourth dielectric layer S4, the lead electrode 32 and the second electrode 30 for constructing the capacitor 24 are formed in each of the capacitor-forming areas 14A, and the coil electrode 22d of the fourth turn is formed in each of the coil-forming areas 14C. Further, as shown in FIG. 15B, in the green sheet 100 to be formed into the fifth dielectric layer S5, the lead electrode 36 and the second electrode 34 for constructing the resistor 16 are formed in each of the resistor-forming areas 14B, and the coil electrode 22e of the fifth turn is formed in each of the coil-forming areas 14C.

Figure 16:
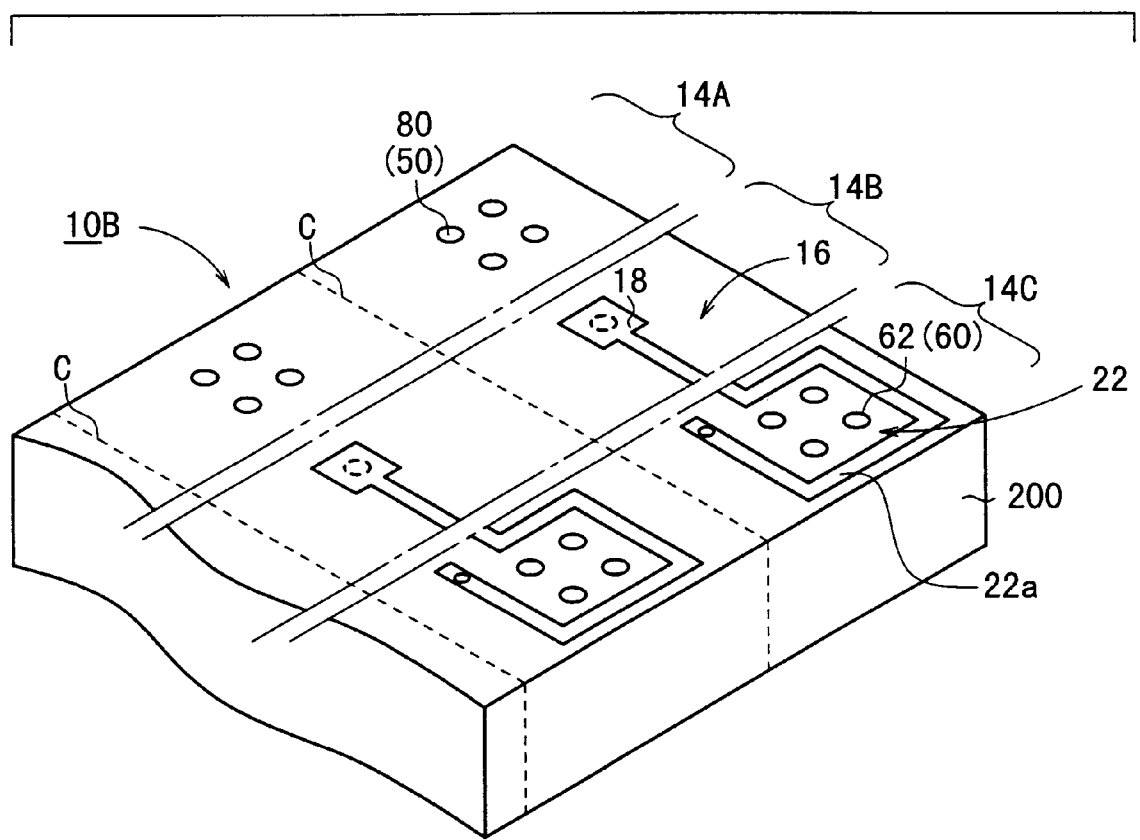
FIG. 16 shows a perspective view illustrating, with partial cutaway, a state in which the green sheets are laminated, sintered, and integrated into one unit to manufacture a wide-width ceramic substrate.

Subsequently, as shown in FIG. 16, the five green sheets 100 are laminated, sintered, and integrated into one unit to manufacture a wide-width ceramic substrate 200. After that, the ceramic substrate 200 is cut at predetermined positions (see cutting lines C) respectively to obtain a plurality of multilayered circuit boards 10B.

Also in the method for producing the multilayered circuit board 10B according to the second embodiment, it is possible to easily manufacture the multilayered circuit board in which the characteristics of respective electronic parts can be improved, and it is possible to realize a small size as well, although a variety of types of electronic parts are formed.

Especially, in the method for producing the multilayered circuit board 10B according to the second embodiment, it is enough to use the one type of green sheet 100. Therefore, when the via-holes are formed by means of the punching out machining based on the die, it is possible to perform the machining with one type of the die. It is possible to effectively reduce the costs by using a common die.

It is a matter of course that the multilayered circuit board and the method for producing the same according to the present invention are not limited to the embodiments described above, which may be embodied in other various forms without deviating from the gist or essential characteristics of the present invention.

As explained above, according to the multilayered circuit board and the method for producing the same concerning the present invention, the characteristics of the respective electronic parts can be improved, and it is possible to realize a small size as well, although a variety of types of electronic parts are formed.

What is claimed is:

1. A multilayered circuit board constructed by laminating a plurality of sheet members, comprising:
    a plurality of via holes formed in each of said sheet members; and
    materials in conformity with types of electronic parts inserted into said via holes with which said electronic parts are formed,
    wherein said plurality of via holes are aligned in an array and include a material having a high dielectric constant inserted into said holes, said holes being interposed between a pair of electrodes for constructing a capacitor.

2. The multilayered circuit board according to claim 1, wherein:

when a plurality of types of said electronic parts are formed, said materials in conformity with said types of said electronic parts are inserted into said holes for forming said plurality of types of said electronic parts.

3. The multilayered circuit board according to claim 1, wherein an insulating material is inserted into said holes in which said electronic parts are not formed.

4. The multilayered circuit board according to claim 1, wherein electrodes for constructing said electronic parts are formed at both end surfaces of said holes for forming said electronic parts.

5. The multilayered circuit board according to claim 1, wherein said holes are formed by means of punching out with a die.

6. A multilayered circuit board constructed by laminating a plurality of sheet members, comprising:

a plurality of via holes formed in each of said sheet members; and materials in conformity with types of electronic parts inserted into said via holes with which said electronic parts are formed, wherein a material having a high magnetic permeability is inserted into said via holes located at a magnetic flux-permeating portion surrounded by electrodes for constructing a coil, and wherein said electrodes for constructing said coil are arranged in a spiral shape surrounding said via holes into which said material having a high magnetic permeability is inserted.

7. The multilayered circuit board according to claim 6, wherein:

when a plurality of types of said electronic parts are formed, said materials in conformity with said types of said electronic parts are inserted into said holes for forming said plurality of types of said electronic parts.

8. The multilayered circuit board according to claim 6, wherein an insulating material is inserted into said holes in which said electronic parts are not formed.

9. The multilayered circuit board according to claim 6, wherein electrodes for constructing said electronic parts are formed at both end surfaces of said holes for forming said electronic parts.

10. The multilayered circuit board according to claim 6, wherein said holes are formed by means of punching out with a die.

* * * * *